United States Patent [19]

Matsubara et al.

[11] Patent Number: 5,762,704
[45] Date of Patent: Jun. 9, 1998

[54] METHOD OF FABRICATING A SILICON SINGLE-CRYSTAL INGOT

[75] Inventors: Jun-ichi Matsubara; Yuji Miyake; Hiroshi Kongoji; Kouji Maeda, all of Tokyo, Japan

[73] Assignees: Mitsubishi Materials Silicon; Mitsubishi Materials Corporation, both of Tokyo, Japan

[21] Appl. No.: 600,803

[22] Filed: Feb. 13, 1996

[30] Foreign Application Priority Data

Feb. 27, 1995 [JP] Japan .................................. 7-064699
Sep. 11, 1995 [JP] Japan .................................. 7-232734

[51] Int. Cl.$^6$ .................................. C03B 15/26
[52] U.S. Cl. .................. 117/13; 117/15; 117/932
[58] Field of Search .................. 117/13, 15, 202, 117/932

[56] References Cited

U.S. PATENT DOCUMENTS

| | | | |
|---|---|---|---|
| 4,973,377 | 11/1990 | Katsuoka et al. | 117/15 |
| 5,183,528 | 2/1993 | Baba et al. | 117/15 |
| 5,246,535 | 9/1993 | Kawashima et al. | 117/15 |

*Primary Examiner*—Felisa Garrett
*Attorney, Agent, or Firm*—McAulay Fisher Nissen Goldberg & Kiel, LLP

[57] ABSTRACT

A silicon single-crystal ingot which is nearly uniform in quality over the entire length of the column portion can be obtained to produce high-quality single-crystal silicon with high product yield and has the bottom column portion having the property close to the properties of the top column portion and the middle column portion. The bottom portion does not vary in shape among product lots and can be reproduced in the same shape. The diameter D2 of the bottom portion 2 is controlled in such a manner that the outer surface of the bottom portion 2a on the column portion side has an inclination angle θ of 10 to 25 degrees with respect to the outer surface of the column portion 1 and extends to the outer surface of the column portion.

23 Claims, 5 Drawing Sheets

METHOD OF FABRICATING A SILICON SINGLE-CRYSTAL INGOT

BACKGROUND OF THE INVENTION

1. Field of the Invention

The present invention relates to a silicon single-crystal ingot and a method of fabricating silicon single-crystal ingot by the Czochralski method (hereinafter referred to as CZ method). In more detail, the present invention relates to a method of controlling the shape of the bottom portion of a silicon single-crystal ingot and the diameter decreasing rate in the bottom portion.

2. Description of the Related Art

According to the conventional CZ silicon single-crystal pulling method, after the shoulder portion of a silicon single-crystal has been formed, the column portion is formed using an ADC (Automatic Diameter Control) and an AGC (Automatic Growth Control) while the pulling rate and the silicon melt temperature are adjusted to maintain the target diameter. The ADC is a feedback control apparatus which controls the pulling rate to adjust the diameter of the column portion to a target value. The AGC is a feedback control apparatus which controls the silicon melt temperature based on the actually measured pulling rate of the column portion to adjust the pulling rate to a target value. After the column portion has reached a predetermined length, the bottom portion is formed. Then the ADC adjusts the pulling rate according to a predetermined program and then adjusts the temperature of the silicon melt by adjusting the power supplied to the heater, so that the diameter of the silicon single-crystal is gradually decreased. Finally, the tang end of the cone is gently separated from the silicon melt so that the single silicon crystal pulling process is ended.

According to the conventional CZ method, the ADC and AGC adjust the diameter of the column portion to a target value by subjecting the diameter of the column portion to a feedback control. However the ADC first feedback-controls the diameter of the bottom portion and then controls it according to the predetermined program. Hence the column portion on the bottom portion side is exposed to a heat history different from those of the column portion on the top portion side and the column portion on the middle portion side. At a result, the property of the column portion on the bottom portion side differs from those of the column portion on the top portion side and the column portion on the middle portion side.

In concrete, according to the conventional CZ method, as shown in FIG. 5, the bottom portion 2 is formed to set the inclination angle θ of the outer surface of the bottom portion 2 with respect to the outer surface of the column portion 1 to 30 to 40 degrees and to adjust the length L of the bottom portion 2 0.9 to 1.1 times the diameter D1 of the column portion 1. The silicon single-crystal thus formed on the bottom portion is taken out of the single-crystal pulling apparatus (or puller). Then the properties of the column portion 1a on the bottom portion side are observed according to the following method. In this case, an abnormal state may be observed. That is, in this method, the middle portion of the silicon single-crystal ingot is first sliced in parallel to the pulling direction. The sliced sample then is thermally treated in a dry oxygen atmosphere at the temperature 1000° C. for 40 hours. Then after the sliced surface of the thermally treated sample has been processed with an etching solution which can etch selectively oxygen precipitation, it is visually observed. FIG. 5 shows the cross-sectional view of the resultant sample. As shown in FIG. 5, oxygen precipitation 3 is prone to be formed abnormally on the B portion and the peripheral portion C of the column portion 1a in the column portion on the bottom portion side each extending from the boundary A between the column portion 1 and the bottom portion 2 of the ingot only a predetermined length X. The oxygen precipitation formed causes defect occurrence such as dislocation and OSF (Oxidation Induced Stacking Fault). These defects cause poor dielectric strength of semiconductor devices and reduction in significant electrical characteristics such as life time of carriers. For that reason, the portion on which oxygen precipitation is formed abnormally does not result in high-quality silicon single-crystal product and decreases the yield as the perfect products.

Even if the bottom portion formed under a program control is shaped under the same program control, the same shape cannot be obtained when the fabrication is repeated. Hence there are large variations among the product lots.

SUMMARY OF THE INVENTION

An object of the present invention is to provide a silicon single-crystal ingot which has small property changes in the top column portion and the middle column portion of the column portion on the bottom side thereof and allows high-quality single-crystal silicon to be produced at high product yield.

Another object of the present invention is to provide a method which can manufacture a silicon single-crystal with uniform quality over the entire length of the column portion.

Further another object of the present invention is to provide a silicon single-crystal fabricating method by which the bottom portion can be reproduced in the same shape without any variations among the product lots.

In the present invention, according to claim 1, as shown in FIG. 1, the silicon single-crystal ingot includes a column portion 1 substantially having a fixed diameter: and a bottom portion 2 sequentially extending to the column portion 1, the bottom portion 2 being formed by reducing the diameter of the diameter (D1) of the column portion 1; the inclination angle θ of the outer surface of a bottom portion 2a on the column portion side extending to the column portion 1 being 10 to 25 degrees with respect to the outer surface of the column portion 1.

Setting the inclination angle to 10 to 25 degrees allows the diameter decreasing rate of the bottom portion on the column portion side to be small, so that the thermal history of the bottom portion on the column portion side agrees substantially with that of the column portion 1a on the bottom portion side. As a result, since the property of the column portion on the bottom portion side is immune to the effect of the bottom portion on the end portion side, it is closely analogous to those of the column portion on the top portion side and the column portion on the middle portion side. Hence since abnormal oxygen precipitation 3 is mainly formed on the bottom portion 2a on the column portion side, oxygen precipitation is formed slightly on the column portion on the bottom portion side 1a or is not formed totally.

With the inclination angle of less than 10 degree, the bottom portion is made longer than required so that the bottom portion forming time is prolonged and the amount of silicon melt consumed for the bottom portion formation is increased wastefully. With the inclination angle of 25 degrees or more, the diameter decreasing rate of the bottom portion on the cylindrical portion side becomes high so that the thermal history of the bottom portion on the column portion side differs largely from that of the column portion on the bottom portion side. Since the function and effect of the invention according to claim 1 becomes more pronounced, it is desirable to select the inclination angle θ to 10 to 15 degrees.

In the present invention according to claim 2 depending on claim 1, the silicon single-crystal ingot includes a step portion 2c formed between the bottom portion 2a on the column portion side and the bottom portion 2b on the end side thereof, the step portion being formed by setting the diameter decreasing rate between the bottom portion 2a on the column portion side and the bottom portion 2b on the end side higher than the diameter decreasing rate of the bottom portion 2a on the column portion side.

By forming the step portion 2c, the bottom portion forming time is not prolonged so much, compared with the conventional bottom portion forming time, even at an inclination angle θ of 10° to 25°, while the length of the bottom portion 2 can be shortened. Hence the amount of the silicon melt which is consumed to form the bottom portion can be suppressed.

In the present invention according to claim 3 depending on claim 1 or 2, the length L of the bottom portion 2 is at least 1.5 times the diameter D1 of the column portion 1.

Where the inclination angle θ is adjusted to the range described above, or the inclination angle θ is set near to the lower limit value, e.g. about 10°, the length of the bottom portion is adjusted to L≧1.5×D1, perferably L≧1.8×D1, by arranging the stop portion 2c. With the length L of the bottom portion 2 being less than 1.5 times, the diameter decreasing rate of the bottom portion on the cylindrical portion side becomes high so that the thermal history of the bottom portion on the cylindrical portion side differs greatly from that of the column portion on the bottom portion side.

In the invention according to claim 4, the method of fabricating a silicon single-crystal by the Czochralski method, is characterized by the steps of controlling the diameter D2 of the bottom portion 2 to a target value by controlling the pulling rate of the silicon single-crystal 22 according to an actually measured value of the diameter D2 of the bottom portion 2 when the bottom portion 2 of the silicon single-crystal 22 is formed; and controlling the pulling rate at which the diameter D2 of the bottom portion 2 is controlled to the target value, by controlling the temperature of silicon melt according to the actually measured value.

As shown in FIG. 4, the ADC feedback-controls the diameter of the bottom portion 2 according to the pulling rate and the AGC feedback-controls the pulling rate which controls the diameter of the bottom portion 2 according to the silicon melt temperature. Thus even when the silicon single-crystal is produced repeatedly, the bottom portion is always formed in the same shape. The symbol D2 shown in FIG. 1 represents the diameter of the bottom portion 2 at a specified location, and represents the length changing as the length of the bottom portion increases.

In the invention according to claim 5 depending on claim 4, the method of fabricating a silicon single-crystal, is characterized by the step of controlling the diameter D2 of the bottom portion 2 in such a manner that the outer surface of the bottom portion 2a on the column portion side makes an inclination angle θ of 10 to 25 degrees with respect to the outer surface of the column portion 1 and extends continuously to the outer surface of the column portion 1.

By adjusting the inclination angle θ to 10° to 25° by means of ADC and AGC, the diameter decreasing rate of the bottom portion on the column portion side is reduced to a small value whereby the thermal history of the bottom portion on the column portion side is adjusted nearly to the same extent as that of the column portion on the bottom portion side. As a result, the property of the column portion on the bottom portion side becomes immune to the effect of the bottom portion on the end portion side, thus being approximated to the property of the column portion on the top portion side and the property of the column portion on the middle portion side.

With the inclination angle θ of less than 10°, the length of the bottom portion is elongated unnecessarily, the bottom portion forming time is prolonged compared with the conventional one and the amount of silicon melt used to form the bottom portion is wastefully increased. With the inclination angle θ of more than 25°, the diameter decreasing rate of the bottom portion on the column portion side becomes high so that the thermal history of the bottom portion on the column portion side differs greatly from that of the column portion on the bottom portion side. It is preferable that the inclination angle θ is 10° to 15° because the function and effect of the invention according to claim 5 is more significant.

In the invention according to claim 6 depending on claim 4 or 5, the method of fabricating a silicon single-crystal is characterized by the step of adjusting the diameter decreasing rate between the bottom portion 2a on the column portion side and the bottom portion 2b on the end side higher than the diameter decreasing rate of the bottom portion 2a on the column portion side to form a step portion 2c.

By forming the step portion 2c, the bottom portion forming time is not prolonged, compared with the conventional method, even when the inclination angle θ is 10° to 25° so that the entire length of the bottom portion 2 can be shortened. Hence the amount of silicon melt to be consumed to form the bottom portion is not increased.

In the invention according to claim 7 depending on any one of claim 4 to 6, the method of fabricating a silicon single-crystal is characterized by the step of controlling the diameter D2 of the bottom portion 2 so that the length L of the bottom portion 2 is set to at least 1.5 times the diameter D1 of the column portion 1.

Where the length L of the bottom portion 2 is less than 1.5 times, the diameter decreasing rate of the bottom portion on the column portion side becomes high so that the thermal history of the bottom portion on the column portion side differs greatly from that of the column portion on the bottom portion side.

In the invention according to claim 8 depending an of claim 4 to 7, the method of fabricating a silicon single-crystal is characterized by the step of controlling the pulling rate V2 of the bottom portion 2a on the column portion side to the range covering 95% to 105% of the average pulling rate V1 over a specified length y of the column portion 1a on the bottom portion.

The column portion 2a on the bottom portion side is formed by calculating the average value V1 of pulling rates over the specified length y of the column portion 1a on the bottom portion, side, pulling silicon single-crystal at a pulling rate of V2 covering 95 to 105% of the resultant average value V1, and then elevating gradually the temperature of silicon melt to decrease the diameter. Where the silicon single-crystal is elevated at a pulling rate other than the above-mentioned range, the portion other than the column portion 1a on the bottom portion side differs greatly from the column portion 1a on the bottom portion side in thermal history.

In the invention according to claim 9 depending on claim 8, the method of fabricating a silicon single-crystalis is characterized by the step in which the specified length y of the column portion 1a on the bottom side is 30 to 100 mm.

The average value V1 of the pulling rate calculated with the specified length of less than 30 mm has a low reliability. Where the specified length exceeds 100 mm, the average value V1 including a relatively fast pulling rate near to the top portion is calculated. Hence when the pulling operation changes from the column portion to the bottom portion, the pulling rate may be sharply increased.

DESCRIPTION OF THE PREFERRED EMBODIMENTS

Figure 2:
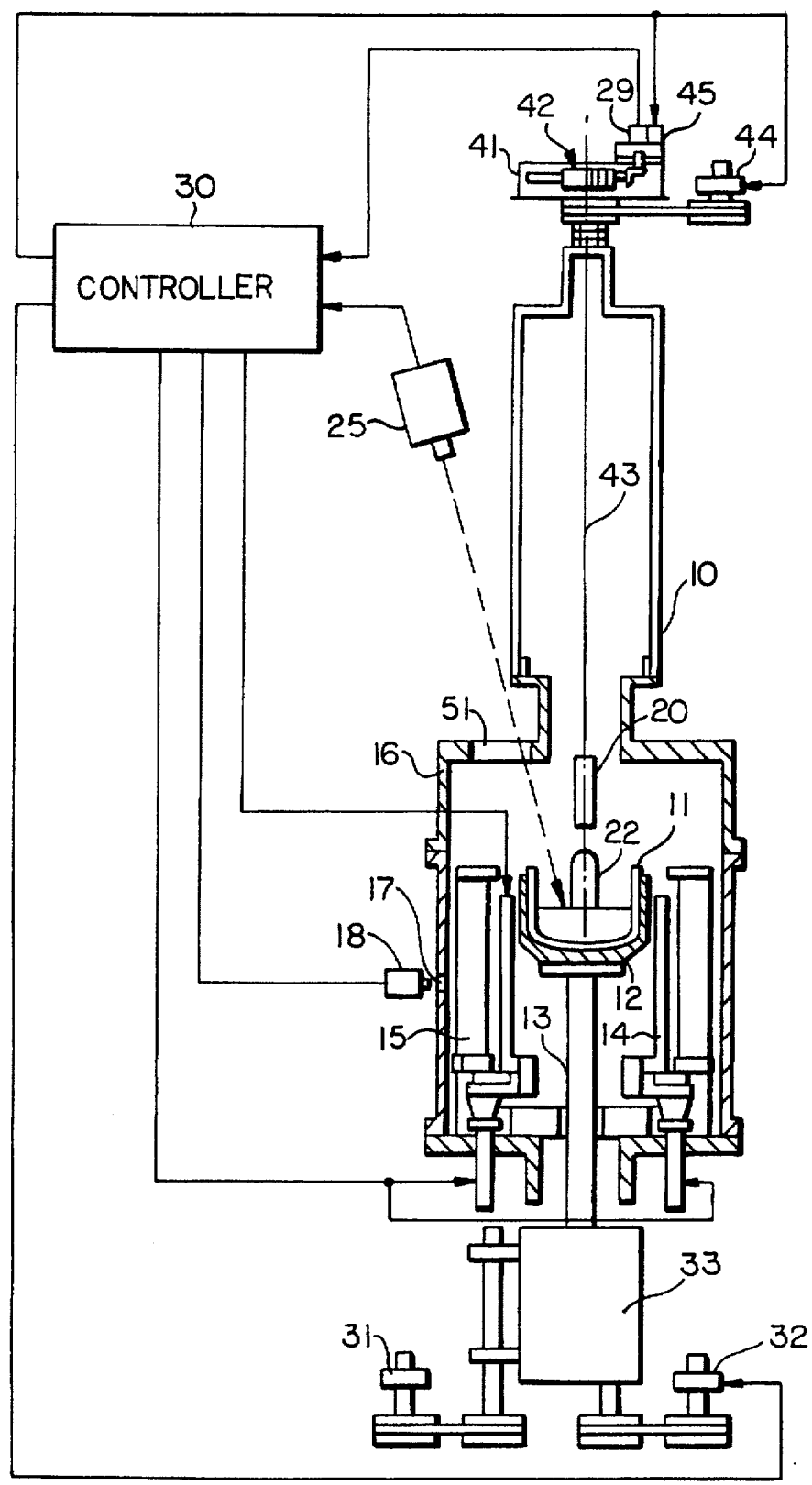
FIG. 2 is a structural view illustrating a silicon single-crystal pulling apparatus according to an embodiment of the present invention.

The aspects of embodiments according to the present invention will be explained as follows:

As shown in FIG. 2, a quartz crucible 11 holding silicon melt is arranged inside the chamber 15 in a single crystal pulling apparatus. The quartz crucible 11 is fixed on the upper end of the rotating shaft 13 via the graphite susceptor 12. Argon gas is supplied into the chamber 16 from the upper portion (not shown) of the chamber 16.

Each drive force of the crucible rotating motor 32 and the crucible elevating motor 31 is transmitted to the lower portion of the rotating shaft 13 via the transmission mechanism 33. This system enables the crucible 11 to be rotated in a predetermined direction and to be traveled in the vertical direction. The heaters 14 are arranged outside the crucible 11 at predetermined intervals. A heat insulating shell 15 is formed between the heaters 14 and the chamber 16. A window 17 is formed at the lower portion of the chamber 16. A radiation pyrometer 18 is arranged outside the chamber 16 to face the window 17.

A window 51 is formed on the shoulder portion of the chamber 16. The television camera 25 is arranged outside the chamber 16 equipped on the upper portion of the window 51 so as to be moved radially to the crucible 11. The television camera 25 as shown with broken line in the figure shoots the vicinity of the crystal growing interface between the silicon melt and the silicon single-crystal 22 via the window 51. The cylinder casing 10 is connected to the upper portion of the chamber 16. The pulling head 41 is arranged on the upper portion of the casing 10 so as to be rotated horizontally. The pulling head 41 is rotated by means of the head rotating motor 44. The wire pulling mechanism 42 is arranged inside the pulling head 41. The wire cable 43 is suspended from the wire pulling mechanism 42 to the center around which the crucible 11 rotates. The elevating motor 45 transmits its drive force to the wire elevating mechanism 42. The wire cable 43 is elevated or descended according to the rotating direction of the output shaft of the elevating motor 45. The seed holder 20 which holds a seed of silicon single-crystal is equipped on the lower end of the wire cable 43.

The speed detector 29 is arranged near to the pulling elevating motor 45 to detect the rotational rate of the elevating motor. The outputs of the radiation pyrometer 18, the television camera 2, and the speed detector 29 are connected to the inputs of the controller 30. The controller 30 which consists of a computer is controlled according to a program stored in, for example, a ROM. The outputs of the controller 30 supplies to the heater 14, the head rotating motor 44, the elevating motor 45, the crucible rotating motor 32, and the crucible elevating motor 31.

In the single crystal pulling apparatus constituted as shown above, a high-purity polycrystalline silicon is first filled in the quartz crucible 11. After the chamber 16 has been evacuated into vacuum, argon substitutes for the atmosphere and then is adjusted to the pressure to several tens Torr. According to the program in the controller 30, the heater 14 melts the polycrystalline silicon in the crucible 11 to control the temperature of the silicon melt. After the seed held by the seed holder 20 has been dipped into the silicon melt, the head rotating motor 44 is driven while the pulling motor 45 drives the wire cable 43 in pulling direction. Thus the seed is lifted while being rotated and the diameter of the lower end of the seed increases. Then the silicon single-crystal 22 (as shown in figure) with a target diameter grows on the lower end of the seed. In than single crystal growing step, the rotating shaft 13 is rotated reversely to the wire cable 43 so that the reversely to each other. In order to remove SiO produced from the silicon melt in the chamber 16, argon is continuously charged into the chamber 16 at the rate of several ten liters/minute.

Figure 3:
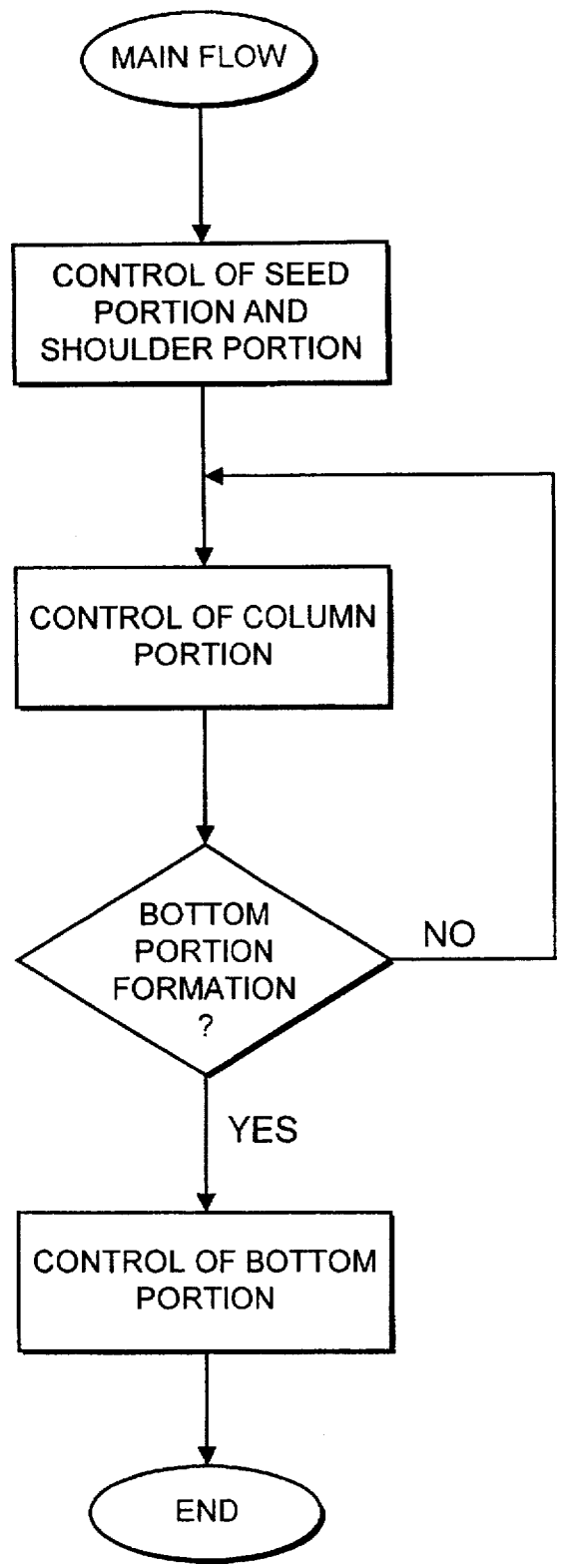
FIG. 3 is a flowchart showing the elevating control of a silicon single-crystal.

The growing silicon single-crystal 22 has the seed portion, the shoulder portion being the upper portion, the column portion 1 having substantially a constant diameter, and the bottom portion 2 being the lower end portion 2. The shape is determined by the pulling rate, silicon melt temperature, relative rotating rate of silicon single-crystal, the image data of the television camera 25, liquid level of silicon melt, and the like. The controller 30, as shown in FIG. 3, controls the seed portion, the shoulder portion, and the column portion and then controls the bottom portion. The diameter control of the column portion 1 is performed by first analyzing the image data of the television camera 25 and then detecting the position of the interface between the silicon single-crystal 22 and the liquid level of the silicon melt. Next, according to the detection result, the ADC and AGC described above adjust the pulling rate and the temperature of silicon melt to maintain the target diameter while the column portion 1 is formed. Since the amount of the silicon melt decreases gradually during the lifting operation of the silicon single-crystal, the rotating shaft 13 is elevated and adjusted to maintain always the position of the silicon melt surface at a fixed value relatively to the heater.

Next, let us explain the diameter control of the bottom portion 2 being the feature of the present invention.

Figure 4:
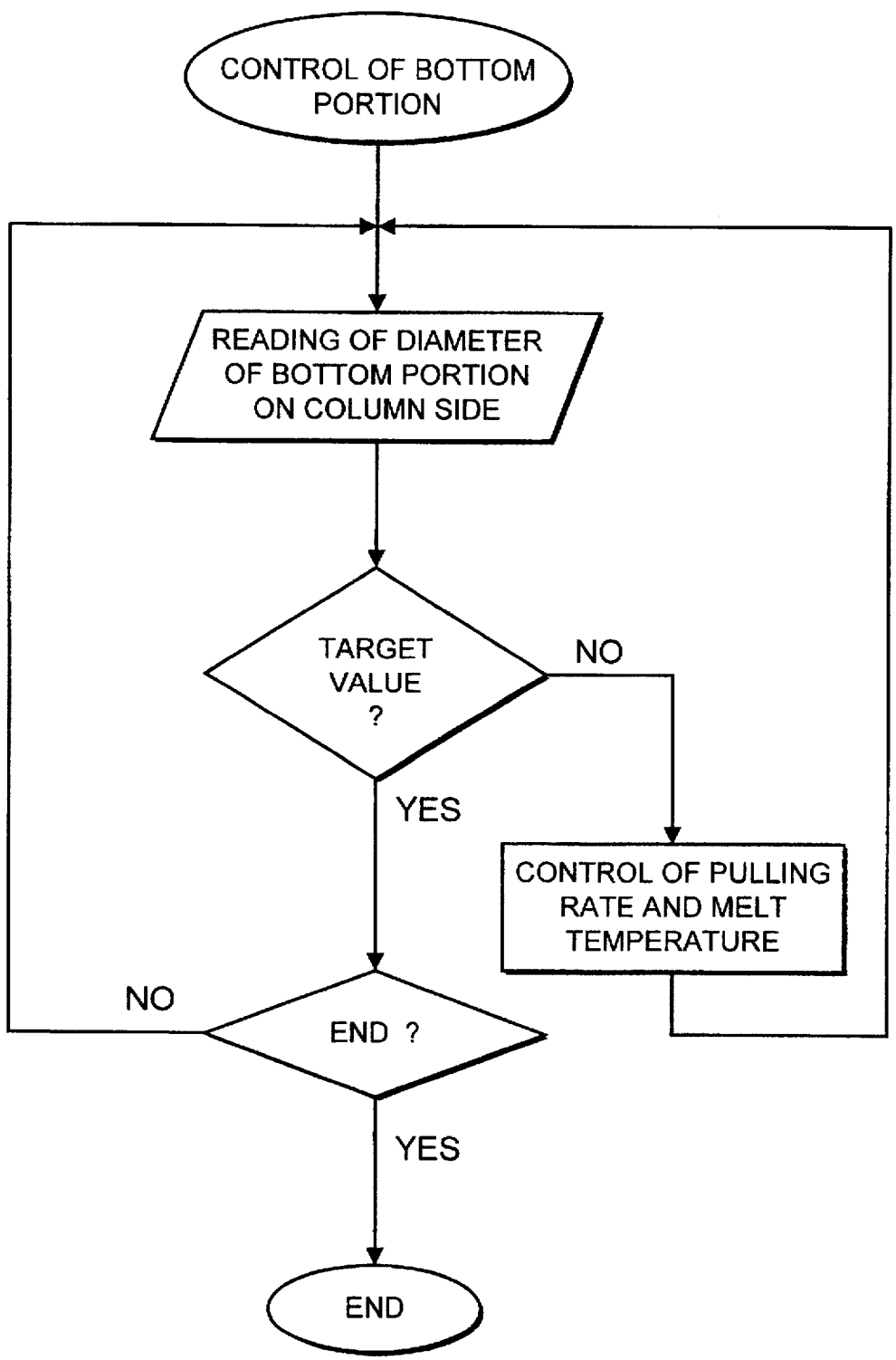
FIG. 4 is a flowchart showing the control when the bottom portion is formed.

As shown in FIG. 4, in the diameter control of the bottom portion 2a on the column portion side of the bottom portion 2, an actual measured value of the diameter is read, according to the output from the television camera 25, like the process for the column portion 1, and then it is checked whether the captured value is a target value. The target value is preset to the program. The target value may be set, for example, as a function of time. When the actually measured value is out of the target value, the pulling rate and the temperature of silicon melt are subjected to a feedback control by means of the ADC and AGC. In concrete, where the actually measured value of the diameter is larger than the target value, the pulling rate is increased or the melt temperature is heighten, whereas, in the opposite case, the pulling rate is decreased or the melt temperature is lowered. In this case, it is desirable to control the pulling rate V2 of the bottom portion 2a to the specified length y, for examples 100 mm, of the cylindrical rate portion 1a on the bottom portion side, for example, 95 to 105% of an average pulling rate V1. This specified length y may be set by the function of time.

Figure 1:
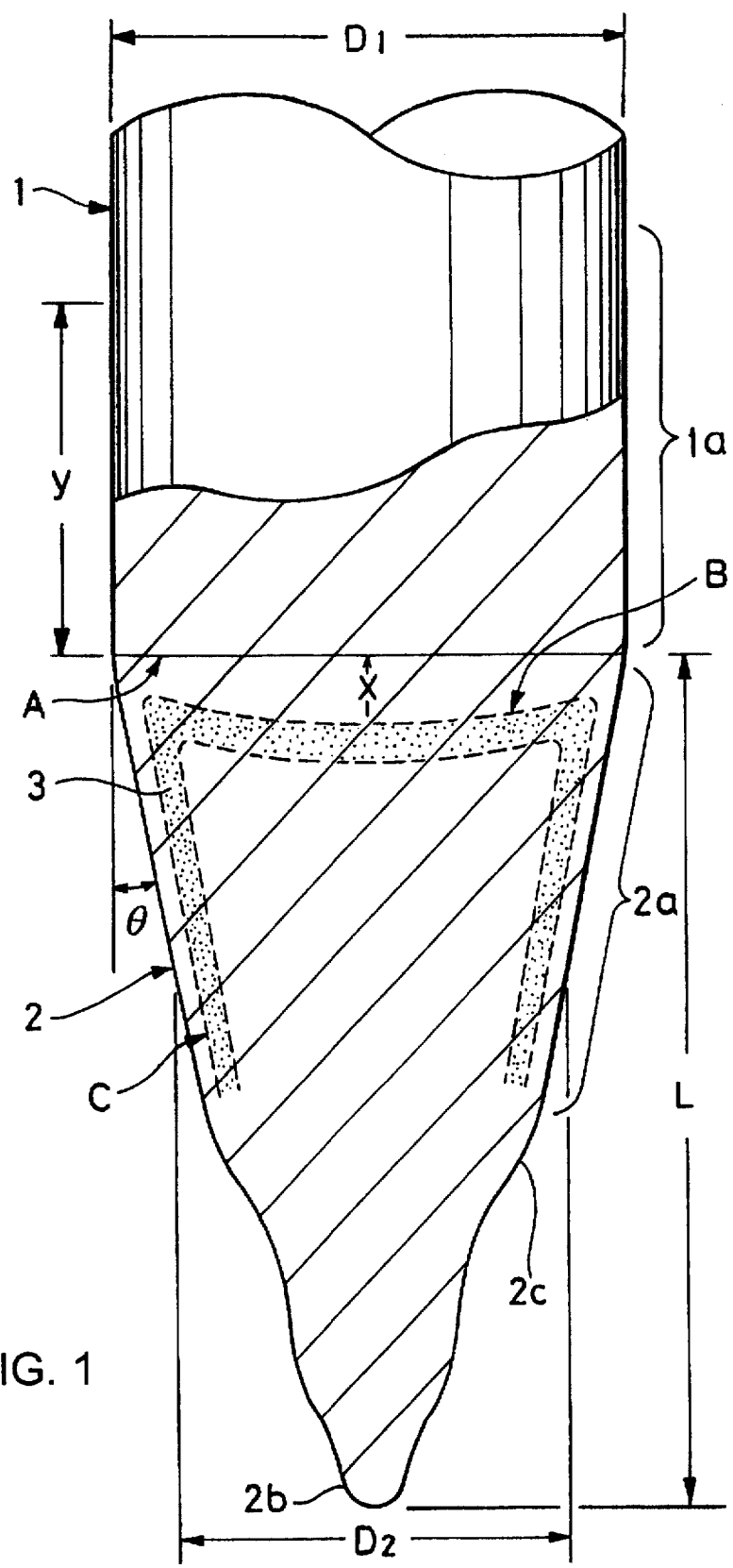
FIG. 1 is a partial cross-sectional view illustrating the silicon single-crystal ingot according to the present invention.

The diameter D2 of the bottom portion 2a on the column portion side, as shown in FIG. 1, is controlled to set the outer surface of the bottom portion 2a on the column portion side to an inclination angle θ of 10 to 25 degrees with respect to the outer surface of the column portion 1 and to extend continuously to the outer surface of the bottom portion 2a. After the bottom portion 2a on the column portion is formed, the diameter D2 is controlled to form the step portion 2c by adjusting the diameter decreasing rate higher than that of the bottom portion 2a on the column portion side. As a result, the diameter D2 of the bottom portion 2 is controlled to set the length L of the bottom portion 2 to at least 1.5 times the diameter D1 of the column portion 1.

Next, examples of the present invention will be explained below with the comparison examples.

(Embodiment 1)

In the apparatus shown in FIG. 2, a silicon single-crystal ingot is produced according to the flowcharts shown in FIGS. 3 and 4. The ingot has a column portion of a diameter D1 of 8 inches (about 205 mm) and is formed of a P-type. (100) plane orientation material.

In preparation of the bottom portion of the ingot, ADC and AGC executes the diameter control of the bottom portion on the column portion side. In this example, the pulling rate V2 of the bottom portion on the column portion side is set to the same value as the average pulling rate V1 over the specified length of 100 mm of the column portion on the bottom unit side, or to V2/V1=1 (100%). The inclination angle θ is adjusted to 15° with respect to the outer surface of the column portion of the outer surface of the bottom portion on the column portion side so that a step portion is formed between the bottom portion on the column portion side and the bottom portion on the end portion side. Thus the bottom portion is formed to adjust the length L of the bottom portion to 360 mm. The length L of the bottom portion is about 1.8 times the diameter D1 of the column portion.

(Embodiment 2) Like the first embodiment, the silicon single-crystal ingot is prepared except that the pulling rate V2 of the bottom portion on the column portion side is adjusted to 95% (V2/V1=0.95) of the average pulling rate V1 over the specified length of 100 mm of the column portion on the bottom portion side.

(Embodiment 3)

The silicon single-crystal ingot is prepared like the first embodiment except that the inclination angle θ is adjusted to 25°.

(Embodiment 4)

The silicon single-crystal ingot is prepared like the first embodiment except that the length L of the bottom portion is 300 mm being about 1.5 times the diameter D1 of the column portion.

(Embodiment 5)

The silicon single-crystal ingot is prepared like the embodiment 1 except that V2/V1 is 0.95 (95%), the inclination angle is 25° and L/D1 is about 1.5.

<COMPARISON EXAMPLE 1>

The silicon single-crystal ingot is prepared like the fifth embodiment except that the V2/V1 is 0.8 (80%). <COMPARISON EXAMPLE 2>

The silicon single-crystal ingot is prepared like the first embodiment except that V2/V1 is 1 (100%), the inclination angle θ is 25° and L/D1 is about 1.25.

<COMPARISON EXAMPLE 3>

The silicon single-crystal ingot is prepared like the first embodiment except that V2/V1 is 1 (100%), the inclination angle θ is 40° and L/D1 is about 1.0.

<COMPARISON TESTS>

Figure 5:
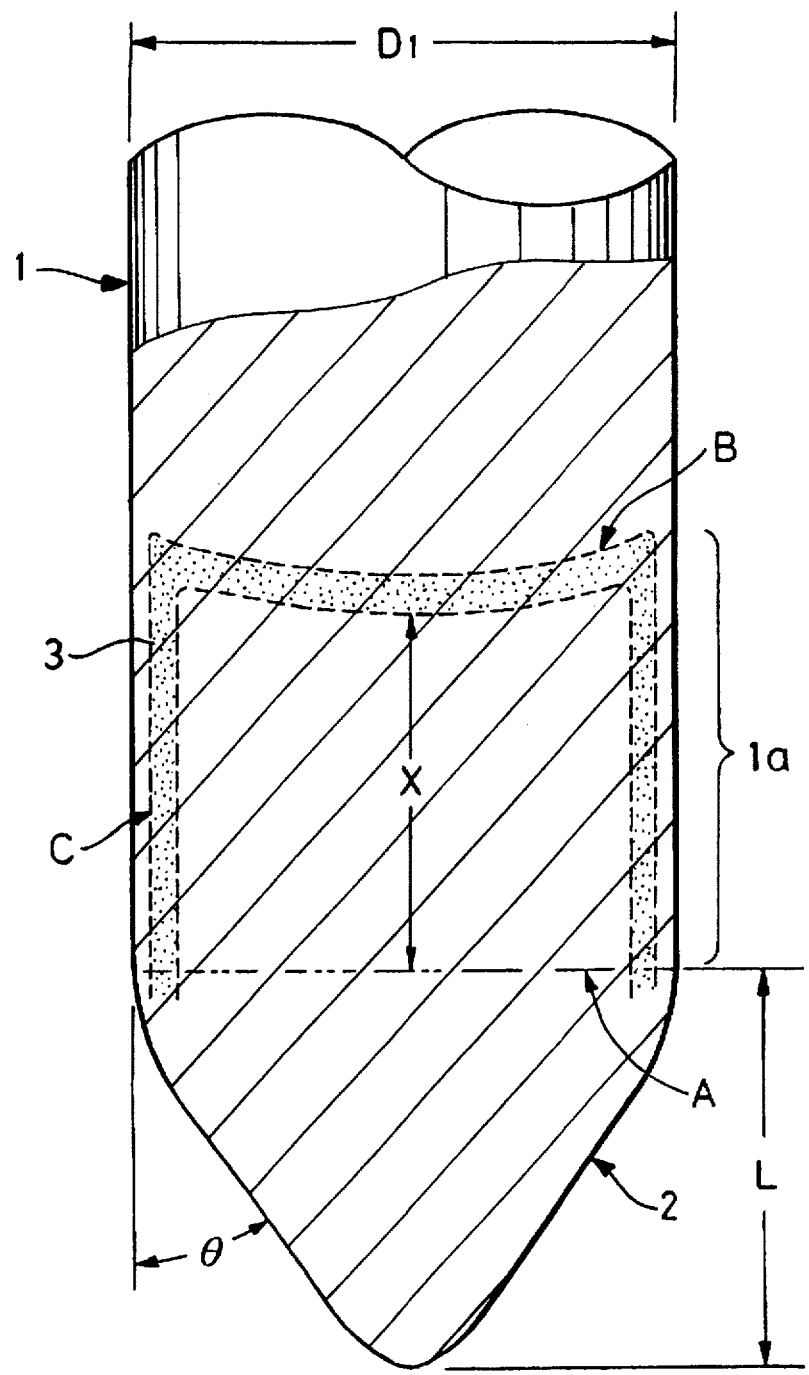
FIG. 5 is a partial cross-sectional view of a conventional silicon single-crystal ingot.

Samples are prepared by slicing each of ingots used in the embodiments 1 to 5 and the comparison examples 1 to 3 in parallel to the pulling direction and at the center thereof. These samples are thermally processed at 1000° C. for 40 hours in a dry oxygen atmosphere. After the slice surface of the thermally treated sample is processed with an etching solution which has an etching selectively to oxygen precipitation, it is observed visually. Table 1 lists results in the embodiments 1 to 5 and comparison examples 1 to 3. In Table 1, symbols x correspond to the symbols x shown in FIGS. 1 and 5. In other words, the symbol x represents the distance ranging from the interface A between the column portion 1 and the bottom portion 2 of the ingot to the peak position of abnormally formed oxygen precipitation. The minus symbol x shows that the oxygen precipitation lies only in the bottom portion, as shown in FIG. 1. The plus sign shows that the peak position of oxygen precipitation lies in the column portion on the bottom portion side, as shown in FIG. 5.

TABLE 1

|  | (V2/V1) × 100% | θ (Degree) | L/D1 | X (mm) |
| --- | --- | --- | --- | --- |
| Embodiment 1 | 100 | 15 | 1.8 | −20 |
| Embodiment 2 | 95 | 15 | 1.8 | −30 |
| Embodiment 3 | 100 | 25 | 1.8 | +50 |
| Embodiment 4 | 100 | 15 | 1.5 | +60 |
| Embodiment 5 | 95 | 25 | 1.5 | +60 |
| Comparison Ex. 1 | 80 | 25 | 1.5 | +100 |
| Comparison Ex. 2 | 100 | 25 | 1.25 | +120 |

As obvious from Table 1, the first embodiment shows that the pulling rate V2 of the bottom portion on the column portion side is the same as the average pulling rate V1 of the column portion on the bottom portion side over the special length of 100 mm, the inclination angle θ is a relatively small angle of 15° and L/D1 is relatively long. The second embodiment shows that V2/V1 is adjusted to be slightly shorter than that in the first embodiment 1. In both of the first and second embodiments, oxygen precipitation is abnormally produced only on the bottom portion. Compared with the first embodiment, in the third embodiment where the angle θ is set to be slightly larger, the fourth embodiment where L/D1 is set to be slightly smaller, or the fifth embodiment where the V2/V1 ratio is set to be slightly smaller, the angle θ is set to be slightly larger and L/D1 is set to be slightly smaller, part of oxygen precipitation is abnormally produced at the column portion on the bottom portion side but the larger part is abnormally produced on the bottom portion on the column portion side.

Moreover, compared with the first embodiment 1, in the comparison example 1 where the V2/V1 ratio is set to be relatively smaller, the comparison example 2 where L/D1 is set to be relatively smaller, and the comparison example 3 where the angle θ is set to be relatively larger and L/D1 is set to be relatively smaller, the large part of the oxygen precipitation is abnormally produced on the cylindrical portion on the bottom portion side.

As described above, in the silicon single-crystal ingot according to the present invention, the outer surface of the bottom portion on the column portion side has an inclination angle of 10 to 25° with respect to the outer surface of the column portion and extends continuously to the outer surface of the column portion. Hence the property of the column portion on the bottom portion side is adversely affected by the effect of the bottom portion on the end portion side. The property of the column portion on the bottom portion side resembles the property of the column portion on the top portion side and the property of the column portion on the middle portion side. This means that oxygen precipitation is abnormally produced mainly on the bottom portion on the column portion, but is produced slightly or is not produced at all on the column portion on the bottom portion side. This feature provides a high product yield of high quality single-crystal silicon and leads to substantially a uniform, excellent quality over the entire length of the column portion.

Furthermore, the bottom portion can be reproduced in the same shape without any variations between product lots, by forming the bottom portion on the column portion side extending from the column portion by means of an ADC and an AGC.

What is claimed is:

1. A method of fabricating a silicon single-crystal by the Czochralski method comprising:

controlling the diameter (D2) of the bottom portion 2 to a target value by controlling the pulling rate of the silicon single-crystal 22 according to an actual measured value of the diameter (D2) of the bottom portion 2 when the bottom portion 2 of the silicon single-crystal 22 if formed and such that the outer surface of the bottom portion 2a on the column portion side makes an inclination angle (θ) of 10 to 25 degrees with respect to the outer surface of the column portion 1 and extends to the outer surface of the column portion; and controlling the pulling rate at which the diameter (D2) of the bottom portion 2 is controlled to the target value, by controlling the temperature of silicon melt according to the actual measured value.

2. The method of fabricating a silicon single-crystal according to claim 1, comprising:

setting the diameter decreasing rate between the bottom portion 2a on the column portion side and the bottom portion 2b on the end side higher than the diameter decreasing rate of the bottom portion 2a on the column portion side to form a step portion 2c.

3. The method of fabricating a silicon single-crystal according to claim 2, comprising:

controlling the diameter (D2) of the bottom portion 2 to set the length (L) of the bottom portion, 2 to at least 1.5 times the diameter (D1) of the column portion 1.

4. The method of fabricating a silicon single-crystal according to claim 3, comprising:

controlling the pulling rate (V2) of the bottom portion 2a on the column portion side to the range covering 95% to 105% of the average pulling rate (V1) over a specified length (y) of the column portion 1a on the bottom portion side.

5. The method fabricating a silicon single-crystal according to claim 4, wherein the specified length (y) of the column portion 1a on the bottom side is 30 to 100 mm.

6. The method of fabricating a silicon single-crystal according to claim 2, comprising:

controlling the pulling rate (V2) of the bottom portion 2a on the column portion side to the range covering 95% to 105% of the average pulling rate (V1) over a specified length (y) of the column portion 1a on the bottom portion side.

7. The method fabricating a silicon single-crystal according to claim 6, wherein the specified length (y) of the column portion 1a on the bottom side is 30 to 100 mm.

8. The method of fabricating a silicon single-crystal according to claim 1 comprising controlling the diameter (D2) of the bottom portion 2 to set the length (L) of the bottom portion 2 to at least 1.5 times the diameter (D1) of the column portion 1.

9. The method of fabricating a silicon single-crystal according to claim 8, comprising:

controlling the pulling rate (V2) of the bottom portion 2a on the column portion side to the range covering 95% to 105% of the average pulling rate (V1) over a specified length (y) of the column portion 1a on the bottom portion side.

10. The method fabricating a silicon single-crystal according to claim 9, wherein the specified length (y) of the column portion 1a on the bottom side is 30 to 100 mm.

11. The method of fabricating a silicon single-crystal according to any one of claim 1 comprising:

controlling the pulling rate (V2) of the bottom portion 2a on the column portion side to the range covering 95% to 105% of the average pulling rate (V1) over a specified length (y) of the column portion 1a on the bottom portion side.

12. The method of fabricating a silicon single-crystal according to claim 11, wherein the specified length (y) of the column portion 1a on the bottom side is 30 to 100 mm.

13. The method of fabricating a silicon single-crystal according to claim 1, comprising:

setting the diameter decreasing rate between the bottom portion 2a on the column portion side and the bottom portion 2b on the end side higher than the diameter decreasing rate of the bottom portion 2a on the column portion side to form a step portion 2c.

14. The method of fabricating a silicon single-crystal according to claim 13, comprising:

controlling the diameter (D2) of the bottom portion 2 to set the length (L) of the bottom portion 2 to at least 1.5 times the diameter (D1) of the column portion 1.

15. The method of fabricating a silicon single-crystal according to claim 14, comprising:

controlling the pulling rate (V2) of the bottom portion 2a on the column portion side to the range covering 95% to 105% of the average pulling rate (V1) over a specified length (y) of the column portion 1a on the bottom portion side.

16. The method fabricating a silicon single-crystal according to claim 15, wherein the specified length (y) of the column portion 1a on the bottom side is 30 to 100 mm.

17. The method of fabricating a silicon single-crystal according to claim 13, comprising:

controlling the pulling rate (V2) of the bottom portion 2a on the column portion side to the range covering 95% to 105% of the average pulling rate (V1) over a specified length (y) of the column portion la on the bottom portion side.

18. The method fabricating a silicon single-crystal according to claim 17, wherein the specified length (y) of the column portion 1a on the bottom side is 30 to 100 mm.

19. The method of fabricating a silicon single-crystal according to claim 1, comprising:

controlling the diameter (D2) of the bottom portion 2 to set the length (L) of the bottoms portion 2 to at least 1.5 times the diameter (D1) of the column portion 1.

20. The method of fabricating a silicon single-crystal according to claim 19, comprising:

controlling the pulling rate (V2) of the bottom portion 2a on the column portion side to the range covering 95% to 105% of the average pulling rate (V1) over a specified length (y) of the column portion 1a on the bottom portion side.

21. The method fabricating a silicon single-crystal according to claim 20, wherein the specified length (y) of the column portion 1a on the bottom side is 30 to 100 mm.

22. The method of fabricating a silicon single-crystal according to claim 1, comprising:

controlling the pulling, rate (V2) of the bottom portion 2a on the column portion side to the range covering, 95% to 105% of the average pulling, rate (V1) over a specified length (y) of the column portion 1a on the bottom portion side.

23. The method fabricating a silicon single-crystal according to claim 22, wherein the specified length (y) of the column portion 1a on the bottom side is 30 to 100 mm.

* * * * *